(12) United States Patent
Slade

(10) Patent No.: US 8,362,778 B2
(45) Date of Patent: Jan. 29, 2013

(54) ARRANGEMENTS AND METHOD FOR SHIMMING A MAGNETIC FIELD

(75) Inventor: Robert Slade, Oxfordshire (GB)

(73) Assignee: Siemens Plc, Frimley, Camberley (GB)

( * ) Notice: Subject to any disclaimer, the term of this patent is extended or adjusted under 35 U.S.C. 154(b) by 364 days.

(21) Appl. No.: 12/729,711

(22) Filed: Mar. 23, 2010

(65) Prior Publication Data

US 2010/0237867 A1  Sep. 23, 2010

(30) Foreign Application Priority Data

Mar. 23, 2009 (GB) .................................. 0904910.7
Mar. 17, 2010 (GB) .................................. 1004361.0

(51) Int. Cl.
*G01V 3/00* (2006.01)
*G01V 3/14* (2006.01)

(52) U.S. Cl. .......................... 324/320; 324/318; 324/321

(58) Field of Classification Search ........... 324/300–322
See application file for complete search history.

(56) References Cited

U.S. PATENT DOCUMENTS

| | | | |
|---|---|---|---|
| 5,003,276 A | 3/1991 | Sarwinski et al. | |
| 5,786,695 A * | 7/1998 | Amor et al. | 324/320 |
| 5,963,117 A * | 10/1999 | Ohashi et al. | 335/306 |
| 6,255,928 B1 | 7/2001 | van Oort et al. | |
| 6,867,592 B2 * | 3/2005 | Gebhardt et al. | 324/318 |
| 2002/0097122 A1 | 7/2002 | Rapoport | |
| 2007/0272394 A1 | 11/2007 | Heid | |
| 2008/0169813 A1 * | 7/2008 | Yamashita et al. | 324/321 |
| 2009/0009171 A1 * | 1/2009 | Tamura et al. | 324/320 |
| 2009/0179720 A1 * | 7/2009 | Ni et al. | 335/302 |

FOREIGN PATENT DOCUMENTS

| | | |
|---|---|---|
| WO | WO 2005/091007 A2 | 9/2005 |
| WO | WO 2005/114242 A2 | 12/2005 |

OTHER PUBLICATIONS

British Search Report dated May 20, 2009 (6 pages).

* cited by examiner

*Primary Examiner* — Melissa Koval
*Assistant Examiner* — Emily Chan
(74) *Attorney, Agent, or Firm* — Crowell & Moring LLP

(57) ABSTRACT

A shim arrangement for increasing the homogeneity of a magnetic field within a homogeneous field region, comprising: shim channels extending within a volume between a magnetic field generator and the homogeneous field region; at least one piece of shim material located within each shim channel; an arrangement for moving each shim piece along the corresponding shim channel; and retaining means for retaining each shim piece in position. Shimming is performed by moving shim pieces within the shim channels, with the magnet at field. No shim pieces are added to, or removed from, the shim channels during the shimming step.

28 Claims, 11 Drawing Sheets

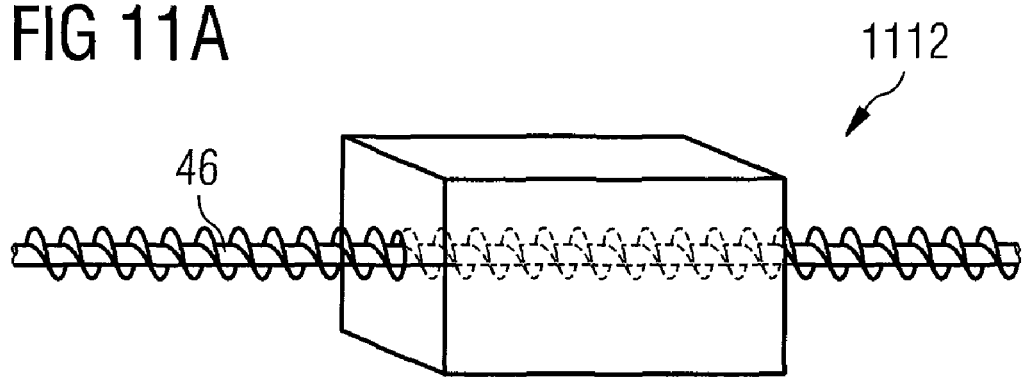
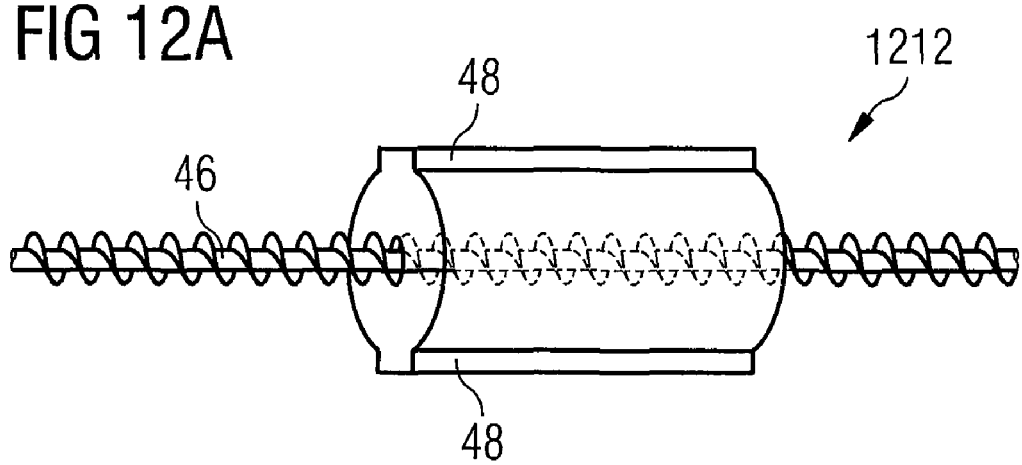
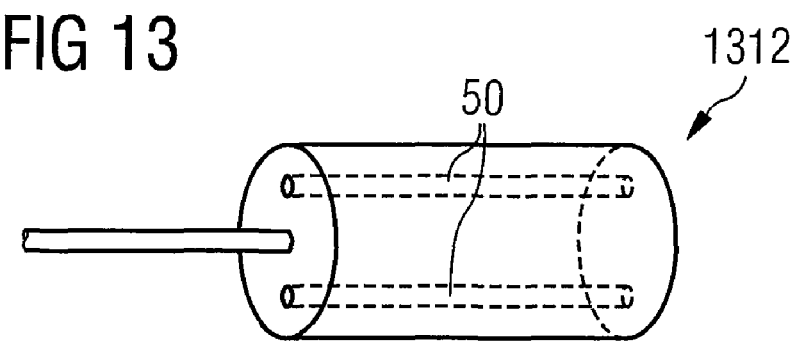

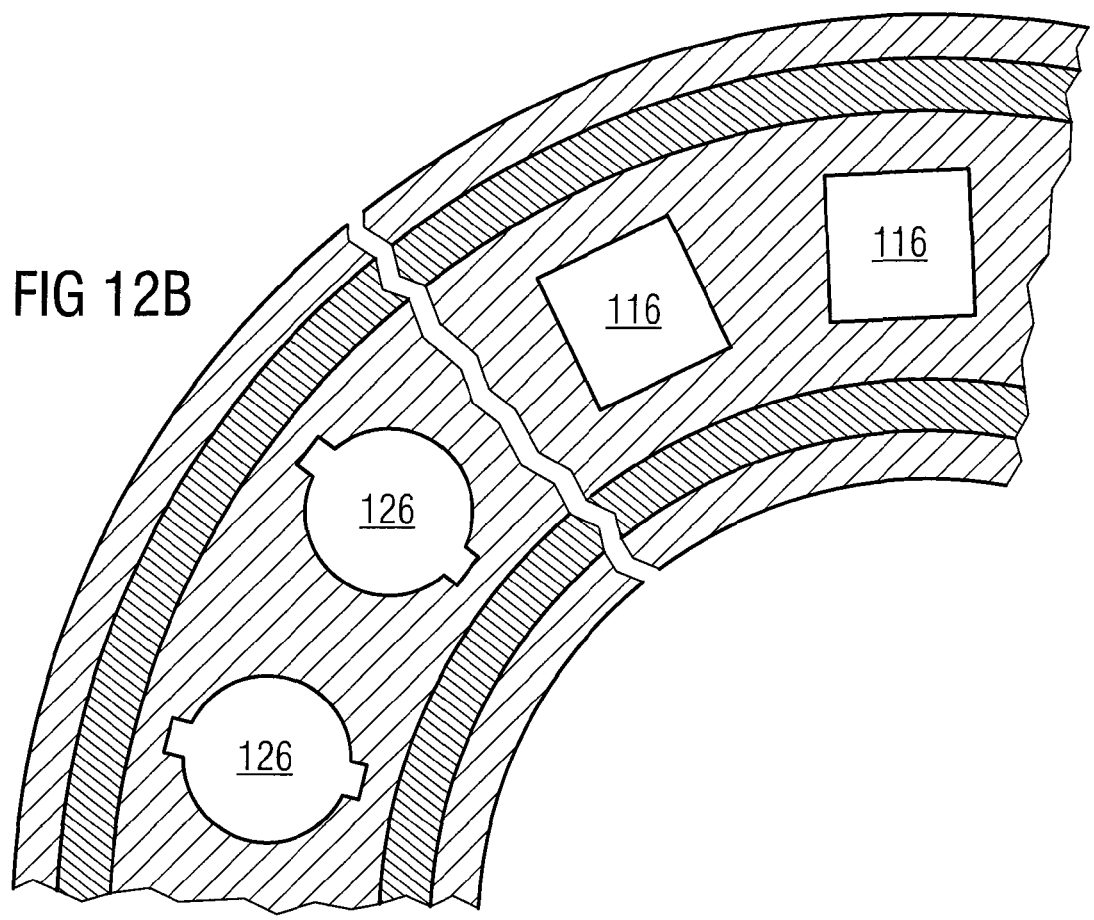

Z component of flux density at ( 0, 0.16m, 0) from 1cm diameter x 1.85cm long saturated SiFe plate located at ( 0, 0, Z )

ARRANGEMENTS AND METHOD FOR SHIMMING A MAGNETIC FIELD

BACKGROUND AND SUMMARY OF THE INVENTION

This application claims the priority of British patent application 0904910.7, filed Mar. 23, 2009 and British patent application 1004361.0, filed Mar. 17, 2010, the disclosures of which are expressly incorporated by reference herein.

The present invention relates to apparatus and methods for shimming a magnetic field. In applications such as magnetic resonance imaging (MRI), it is necessary to provide a very homogeneous background magnetic field. For example, a magnetic field of flux density 0.1 T or more must have an inhomogeneity of about 40 parts per million or less peak to peak over an imaging volume of, for example, a 50 cm diameter sphere.

Conventionally, small pieces of ferromagnetic material, such as sheet mild steel, are strategically arranged in calculated positions around the imaging volume to compensate for inhomogeneity in the magnetic field produced by the magnet, in a process known to those skilled in the art as "passive shimming". For example, a typical MRI magnet may be cylindrical in shape, formed of coils of superconducting wire and housed within a cylindrical cryogen vessel, itself housed within a hollow cylindrical outer vacuum chamber (OVC) which thermally isolates it from ambient temperature. Within the bore of the outer vacuum chamber is positioned a cylindrical gradient coil assembly. This is typically a moulded artefact containing resistive coils within a potting material such as an epoxy resin, and is used to produce orthogonal magnetic field gradients. The resistive coils include gradient coils themselves, and radially outside the gradient coils, gradient shield coils may optionally be provided to reduce the magnitude of magnetic field from the gradient coils reaching the outer vacuum container (OVC). Within the moulded artefact are provided shim slots. These are holes, typically of rectangular cross-section, and typically provided between the gradient coils and the gradient shield coils. Shim trays, of similar rectangular cross-section, are located within the shim slots. Each shim tray contains a number of shim pockets along its length. Pieces of sheet ferromagnetic material, called shim plates, typically mild steel with reproducible magnetic properties, such as that used in transformer laminations, are placed within the shim pockets of the shim trays, and the shim trays loaded into the gradient coil assembly. The pieces of ferromagnetic material affect the magnetic field produced by the magnet, and may be used to improve the homogeneity of the resultant magnetic field. A shim algorithm is used to calculate the number and distribution of the shim plates required to reduce the inhomogeneity of the magnetic field within the imaging volume to the desired level. The shim trays may also or alternatively be placed between the radially outer surface of the gradient coil assembly and the bore of the OVC, or between the radially inner surface of the gradient coil assembly and a body (RF) coil within the bore of the gradient coil assembly.

Shimming conventionally proceeds as follows. A magnet is initially brought to field, and the magnetic field variation is measured over the imaging volume, typically using an array of nuclear magnetic resonance (NMR) probes. Bringing the magnet to field involves gradually increasing electric current flowing through the superconducting coils, a process known as ramping-up. The ramping-up process takes time, and consumes cryogen coolant, as heating occurs within the cryogen vessel. In addition to the time spent ramping, which is typically at least half an hour, potentially several hours, the magnet must be allowed to reach equilibrium, which takes a further one to two hours.

Once the magnetic field variation has been measured, which may be performed using an NMR field camera to map the flux density on the surface of a sphere and decompose this into a sum of spherical harmonics to describe the inhomogeneity, known algorithms may be used to calculate a suitable distribution of shim plates to improve the homogeneity of the magnetic field within the imaging volume. The current in the superconducting magnet is then removed. This "ramping-down" procedure consumes time, and cryogen, similarly to the ramping-up procedure described above. When the magnet has been ramped down, the shim trays are removed from the gradient coil assembly; shim plates are placed in calculated positions in the shim pockets in the shim trays. The shim trays are then replaced in the gradient coil assembly.

The shim plates cannot be loaded or removed at field for safety reasons: significant forces, of hundreds of newtons, are experienced as the shim plates move through a steep magnetic field gradient at the open ends of the bore of a cylindrical magnet. Some experiments have been done on removing and replacing the shim trays with the magnet "at field", but these have proved less than satisfactory.

The process of ramping up and measuring the magnetic field homogeneity is then repeated. It is unlikely that such shimming will achieve an adequately homogeneous magnetic field in a single iteration due to small errors in the accuracy of positioning of individual shim plates. Typically, two or three shim iterations are required, needing three or four ramping up and two or three ramping down procedures. This is time consuming and wasteful of cryogen coolant.

The present invention aims to provide methods and equipment for effectively shimming a magnetic field produced by a magnet, particularly a superconducting magnet, without the need to ramp down the magnet between shim operations. Avoiding repeated ramping cycles saves time on installing or re-commissioning a superconducting magnet, and reduces consumption of cryogen. Quenches, when a superconducting magnet reverts to a resistive state and loses its stored energy as heat into the cryogen, typically occur only during ramping. By reducing the need for ramp cycles, the likelihood of a quench is reduced by the present invention. The method and apparatus of the present invention is applicable to cylindrical superconducting magnets.

The present invention accordingly provides methods and apparatus as defined in the appended claims. In particular, the present invention provides apparatus and methods for shimming a magnetic field by moving shim pieces within shim channels positioned around a magnetic field to be shimmed. No shim pieces are added to, or removed from, the shim channels during the shimming operation. As no shim pieces need to traverse the steep magnetic field gradient at the open ends of the bore of a cylindrical magnet, the shimming operation may be carried out with the magnet at field. It is unnecessary to ramp the magnet down at all during shimming, according to the methods of the present invention.

Other objects, advantages and novel features of the present invention will become apparent from the following detailed description of the invention when considered in conjunction with the accompanying drawings.

BRIEF DESCRIPTION OF THE DRAWINGS

FIGS. 11A-11B show an example of a shim piece and a complementary shim channel profile, according to an embodiment of the present invention;

FIGS. 12A-12B show another example of a shim piece and a complementary shim channel profile, according to an embodiment of the present invention;

FIG. 13 shows an example of a shim piece having through-holes allowing circulation of a fluid for temperature regulation;

DETAILED DESCRIPTION OF THE DRAWINGS

Figure 1:
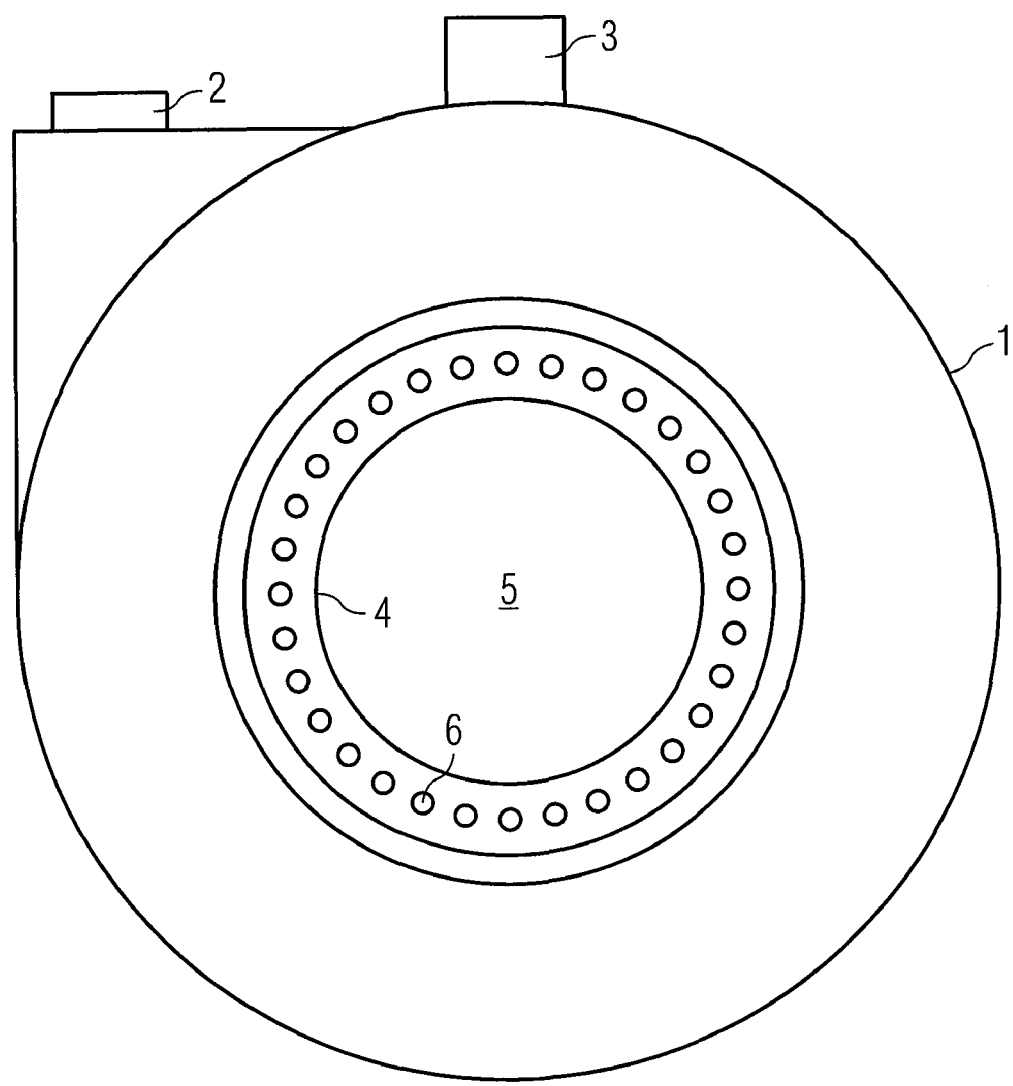
FIG. 1 shows a schematic end-view of a superconducting magnet assembly modified according to an embodiment of the present invention.

FIG. 1 schematically represents an end view of a superconducting magnet arrangement modified according to the present invention. A hollow cylindrical superconducting magnetic field generator comprises an outer vacuum container 1 which contains a superconducting magnet, and cooling means, for example a refrigerator 2, to keep the superconducting magnet sufficiently cold that superconductivity is possible. An access turret 3 is schematically represented, and enables access into the outer vacuum container 1, to reach the magnet, to add or remove cryogen, to pass cables or pipes as necessary.

Hollow cylindrical gradient coil assembly 4 is located within bore 5 of the cylindrical outer vacuum container 1, and provides a bore within which an object to be imaged may be placed, such as a patient. Gradient coil assemblies are commonly provided in the bore of cylindrical outer vacuum containers, for example as used in cylindrical MRI (magnetic resonance imaging) magnets. According to a feature of the illustrated embodiment of the invention, a number of shim channels 6 are provided within the material of the gradient coil assembly. These channels extend through the gradient coil assembly, in axial directions-that is to say, directions parallel to the axis A-A (FIG. 3) of the cylindrical outer vacuum container 1. In the present description and the appended claims, the term "radial" will be used to indicate directions perpendicular to the axis A-A (FIG. 3) of the cylindrical outer vacuum container 1.

As will be discussed in more detail below, the shim channels may also or alternatively be placed between the radially outer surface of the gradient coil assembly and the bore surface of the OVC, or between the radially inner surface of the gradient coil assembly and the homogeneous region. A body (RF) coil may be positioned within the bore of the gradient coil assembly, and the shim channels may be provided in positions radially located between the gradient coil assembly and the body (RF) coil.

Figure 2A:
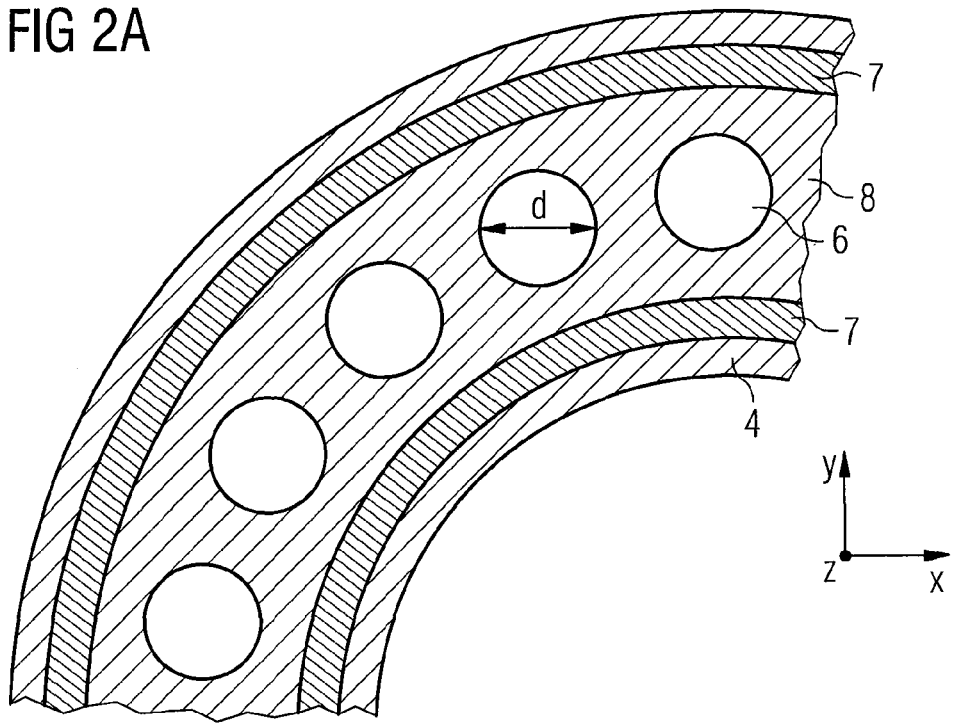
FIGS. 2A and 2B each show a schematic partial radial cross-section of a gradient coil assembly modified according to an embodiment of the present invention.

FIG. 2A shows an enlarged partial cross section of the gradient coil assembly 4 shown in FIG. 1. A number of conventional gradient coils 7 and gradient shield coils 7A are provided embedded within a potting material 8, typically an epoxy resin. The gradient coils are capable of generating rapidly varying magnetic fields oriented in the z direction with gradients in orthogonal directions x, y, z. The gradient coil assembly is arranged such that shim channels 6 may be provided, through the axial length of the gradient coil assembly between the gradient coils 7 and the gradient shield coils 7A, without impeding their operation.

Figure 2B:
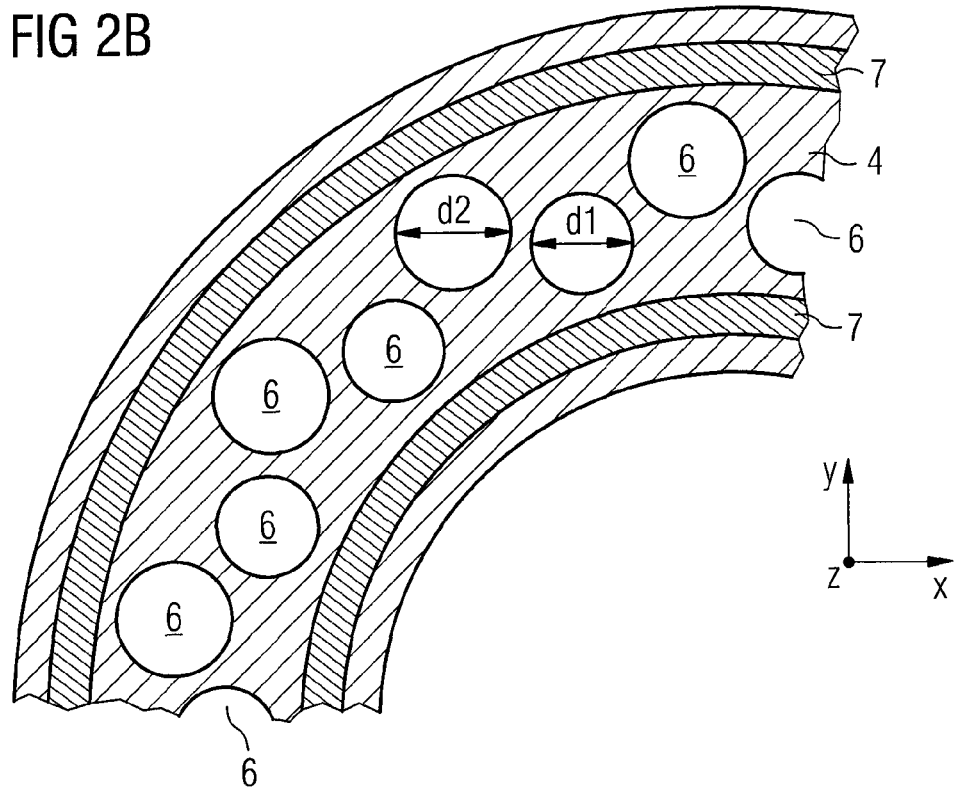

The shim channels 6 resemble known shim slots, but may be only 5-15 mm in cross-sectional diameter d. In a typical whole-body MRI system, a relatively large number of the shim channels 6 may be provided. For example, in the described embodiments of the present invention, the number of shim channels may be in the range 90-400, although far fewer than this are shown for clarity in the drawings. It is expected that the shim channels will be circular in cross section, for mechanical strength, and have a diameter d of about 5-15 mm, although the present invention is not limited to shim channels of this range of sizes or any particular cross sectional shape. The provision of a large number of small, circular cross-section channels, compared to a small number (typically 16, 20 or 24) of rectangular cross-section channels, having similar total volume, is preferable because the gradient coil assembly can be made stiffer and more resistant to vibration and flexing. The shim channels 6 may all be arranged a common radial distance from the axis of the gradient coil (as shown in FIG. 2A), or more than one ring of shim channels may be provided, at different radial distances from the axis of the gradient coil (as shown in FIG. 2B). The shim channels may have differing diameters d1, d2. In a preferred embodiment, 128 shim channels are provided, each with a diameter of 8 mm, staggered on two differing radii, as shown in FIG. 2B.

The present invention relates to a particular type of shim arrangement, including shim devices which may be provided within shim channels 6; and a method for shimming the field of the magnet using such shim arrangement. The present invention applies to shim devices located within shim channels, and is not limited to shim channels formed within gradient coil assemblies. Indeed, shim channels of the present invention may be provided within any convenient body, or in the spaces between bodies (e.g.: between OVC bore surface and gradient coil assembly outer diameter), and extend within a volume between a magnetic field generator 1 and a homogeneous field region 10, for example, a 50 cm diameter sphere. Shim channels may be placed between the radially outer surface of the gradient coil assembly and the bore surface of the OVC, or between the radially inner surface of the gradient coil assembly and the homogeneous region. A body (RF) coil may be positioned within the bore of the gradient coil assembly, and the shim channels may be provided radially between the gradient coil assembly and the body (RF) coil.

Figure 3:
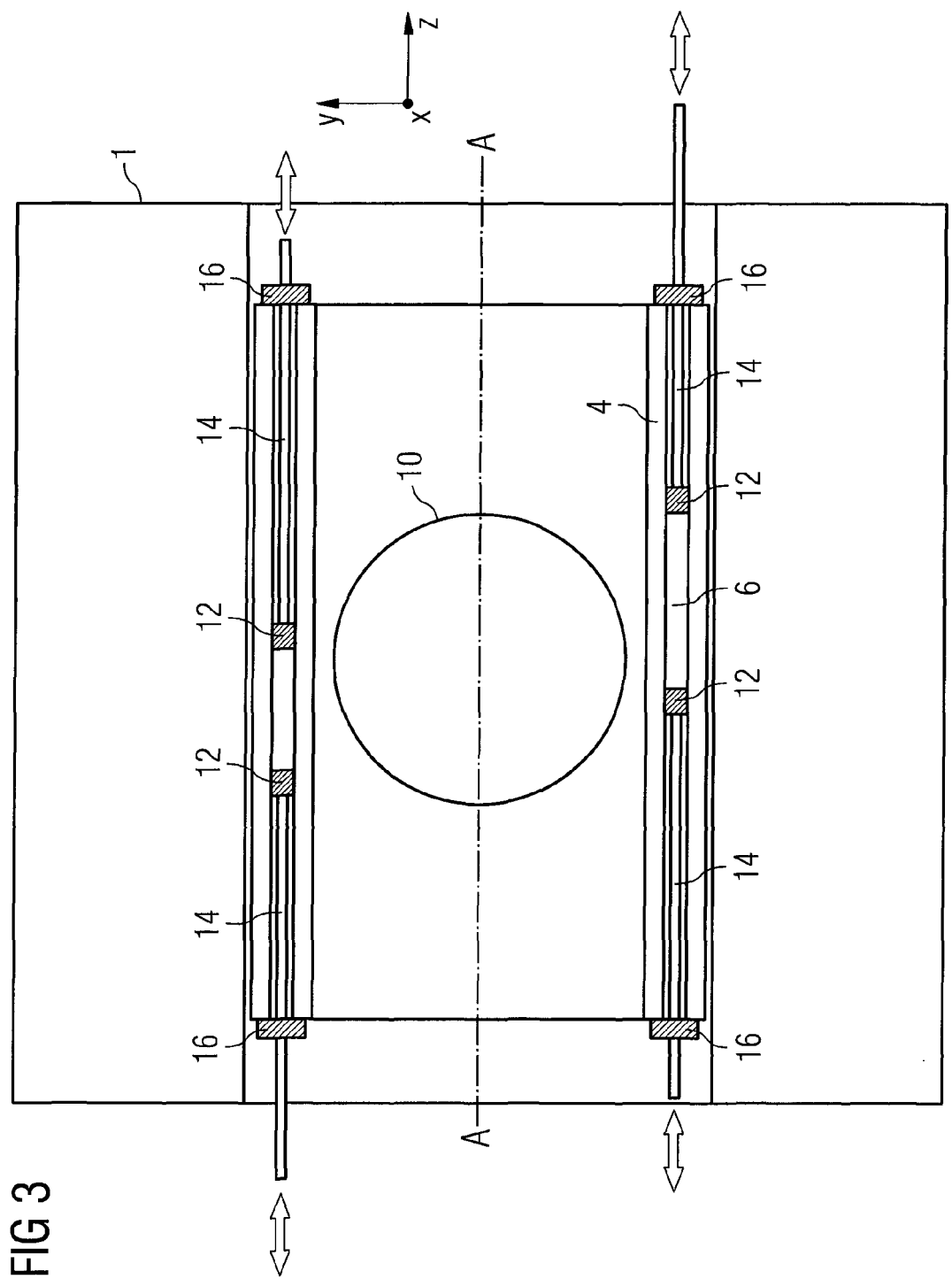
FIG. 3 shows a partial enlargement of an axial cross-section through a superconducting magnet and gradient coil assembly according to an embodiment of the present invention.

FIG. 3 shows an axial cross-section through a superconducting magnet arrangement similar to that shown in FIG. 1, according to an embodiment of the present invention. Axis A-A is shown, and the whole assembly is substantially symmetrical about this axis. Centrally within the magnet assembly, an imaging region 10 is shown. The superconducting magnet is required to produce a very homogeneous magnetic field within the imaging region, which may also be referred to as the homogeneous region. The shimming devices of the present invention are provided to compensate for inhomogeneities in the magnetic field produced by the magnet in the imaging region.

According to an embodiment of the present invention, shown in FIG. 3, shim pieces 12 are provided, two in each shim channel 6. Each shim piece 12 is connected to a rod 14 which is long enough to allow an operator to move the shim piece 12 along the shim channel for at least half its length, preferably its full length. Clamps 16 are provided near the ends of each shim channel, for example on the ends of the gradient coil assembly 4. These clamps are accessible to the user, enabling the rods 14 to be clamped at any desired position, thereby retaining the corresponding shim piece 12 in a selected position within the shim channel 6. Clamps 16 may be replaced by any suitable retaining means. The shim pieces are positioned so as to affect the magnetic field produced by the superconducting magnet in the imaging region so as to modify its homogeneity. According to a feature of the invention, the position of the shim pieces 12 within the shim channels 6 may be modified with the magnet at field. While the shim pieces may be moved axially within the shim channels, no shim pieces need be removed from the shim channels, and no shim pieces need be introduced into the shim channels during shimming and while the magnet is at field. The present invention avoids the need to change the quantity of shim material present within the bore of the magnet 1, but provides shimming by rearranging the shim pieces which are already present.

The present invention employs the fact that forces acting on the shim pieces 12 are relatively small when they are inside the shim channel 6 with the magnet at field, those forces being of the order of a few newtons. On the other hand, it has been observed that much greater forces (hundreds of newtons) act on the shim pieces as they are removed from the shim channel, or inserted into the shim channel. This is a result of a large magnetic field strength gradient present at the ends of the shim channels, due to their proximity to the open ends of the cylindrical magnetic field generator, compared with a much smaller magnetic field strength gradient along the length of the shim channels. As a result, it has been found to be easy and safe to move the shim pieces 12 along the shim channels 6, provided that no attempt is made to remove the shim pieces from the shim channels, and no attempt is made to introduce further shim pieces into the shim channels.

According to the present invention, therefore, an array of shim pieces 12, for example of iron or steel, are introduced into the shim channels 6 before ramping up the magnet. The position of the shim pieces may be adjusted with the magnet at field, using a suitable arrangement for moving each shim piece along the corresponding shim channel. For example, this may be achieved by driving rods 14 attached to each shim piece 12 and accessible to an operator, in to or out of the associated shim channel as schematically indicated by arrows 17. The rods 14 may be retained, for example by a clamp arrangement 16, in a desired position, to fix the position of the corresponding shim piece.

In the embodiment illustrated in FIG. 3, two rods 14 are inserted in each shim channel 6, one from each end. In an example embodiment, the rods 14 are flexible fibreglass rods, such as used in drain cleaning equipment, cut to a suitable length, at least half the length of the shim channel 6, but preferably the full length. The shim pieces 12 may each be attached to a corresponding rod by clamping, adhesive bonding, or the use of sprung barbs. Any retaining means may be used, provided that it allows the shim piece to be driven to-and-fro within the shim channel 6 against a force of up to a maximum of about 100N. Each rod has a shim piece 12 attached to its end. The shim pieces may be of iron, or a suitable steel or any other magnetic material as appropriate. Each shim piece may be shaped as deemed appropriate, for example as a disc, plate, ball, cylinder, cuboid and so on.

The shim pieces and the attached rods are installed within the shim channels before the magnet is ramped up. This installation may be performed at the factory, before the magnet assembly is transported to the customer site.

In operation, the shim pieces 12 can be moved to-and-fro within the shim channel by pulling or pushing on the attached rod 14. The rod can be clamped in any required position with a suitable simple clamp 16 at the opening of the shim channel.

When the magnet is commissioned, or re-commissioned, the magnet may preferably be ramped to field with the rods 14 pulled out to their fullest extent, bringing the shim pieces 12 as far away from the imaging region 10 as possible, to minimise their effect on the magnetic field in the imaging region 10. The shim pieces 12 are secured in these positions by clamping 16 the attached rods 14 near the open end of each shim channel. The magnet is then ramped to field, and its magnetic field plotted over the surface of the imaging region 10. The force acting on each shim piece 12 in these positions can be shown to be small and safe.

Shimming is performed by moving the positions of selected shim pieces by calculated or estimated distances, whereby the homogeneity of the magnetic field within the imaging region 10 may be modified. Calculation or estimation of the optimum positions for the various shim pieces may be done based on the experience of a skilled user, or may be based on mathematical algorithms. A suitable shim algorithm can be used to find the required axial position of each shim piece 12. The objective is to make the resultant influence of the shim pieces on the magnetic field in the homogeneous region equal and opposite to the inhomogeneity of the field from the superconducting magnet within that region, as with conventional passive shimming.

It is possible to adjust the axial position of each shim piece with millimetre resolution, unlike conventional shim trays with fixed pockets which have a resolution of several centimetres. Typically, the shim arrangement of the present invention allows the provision of many more shim channels 6 than would have been possible for conventional shim trays. Typically, there is space for at least six times as many shim channels 6 as conventional trays, possibly 12-24 times as many (e.g. 192-384 shim channels 6). This compensates for the reduced number of shim elements present in each channel compared to conventional tray and pocket shimming.

The shim pieces 12 may be moved to their calculated required positions simply by using a ruler to measure the remaining amount of rod 14 protruding from the end of the shim channel 6. Alternatively, the rods themselves may be marked with a scale indicating the position of the attached shim piece with respect to the open end of the shim channel 6, or with respect to the axial centre of the imaging region, for example. According to the present invention, this repositioning of the shim pieces 12 may be carried out with the magnet at field, and movement of each shim piece may require a force of typically no more than about 100N, although this maximum force will increase with increasing magnetic field gradients and increasing size of the shim pieces. None of the shim pieces are removed from the shim channels during shimming, and no further shim pieces are added to the shim channels during shimming.

Once the shim pieces 12 have been relocated into their calculated or estimated required positions, the rods 14 are clamped in place and the magnetic field of the imaging region 10 may be re-plotted. If the magnetic field in the imaging region is still not sufficiently homogeneous, the process of calculating or estimating required positions for the shim pieces, moving the shim pieces to their required positions and re-plotting the magnetic field of the imaging region may be repeated. This process may be carried out with the magnet at field. No ramping of the magnet is required, so this is a very fast and efficient method of shimming.

When the modified homogeneity of the magnetic field in the imaging region is satisfactory, the protruding ends of the rods 14 may be simply cut off. Depending on the flexibility of the material of the rods, they may alternatively be bent through 90 degrees and tied out of the way with tie-wraps. Whatever method is used, the ends of the gradient coil assembly, the shim channels 6, rods 14 and clamps 16 are typically hidden by bore end "looks" covers, conventionally provided to conceal the working parts of the magnet assembly from operators and patients.

Figure 4:
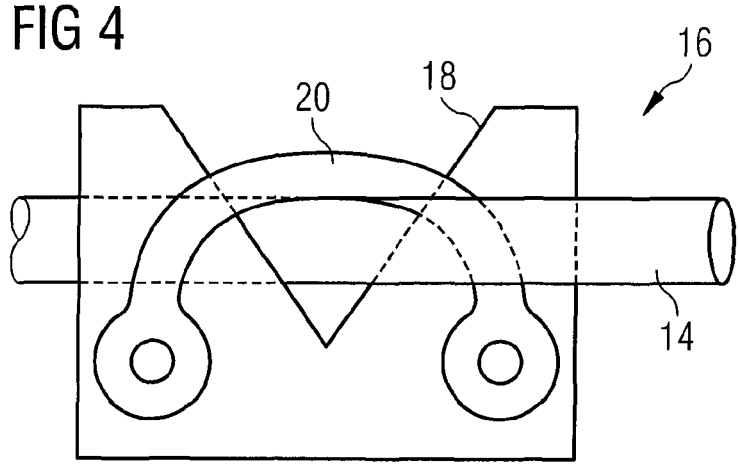
FIGS. 4-5 show examples of retention or clamping devices useful in some embodiments of the present invention.
Figure 5:
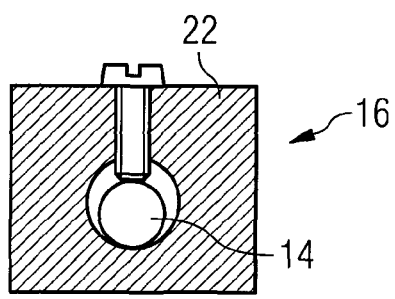

The use of flexible fibreglass rods 14 clamped in simple V-shaped slots 18, for example using an elastomer retainer 20 under tension is envisaged, as shown in FIG. 4. Any other suitable arrangements may be used, such as a screw clamp 22 shown in FIG. 5, which is preferably of a non-magnetic material such as brass or nylon.

Air, or other fluid, of a controlled temperature may be circulated through the shim channels 6 to keep the shim pieces 12 at a stable temperature, thus avoiding changes in their magnetization. The shim pieces should either be made a relatively loose fit in the shim channel, or through-holes should be provided through the shim pieces, as described below with relation to FIG. 13.

As illustrated in FIG. 2B, shim channels 6 may be provided at two or more differing radial positions. The diameters d1, d2 of the shim channels may vary, along with the radial cross-sectional diameters of the shim pieces placed in the shim channels. The ability to use shim pieces of different sizes, and at different radial positions, provides further degrees of freedom for the shim calculation, which facilitates finding a distribution of shim piece positions that shims the magnetic field to a satisfactory homogeneity.

Shim pieces which are not required for modifying the homogeneity of the magnetic field within the imaging volume can be left at an end of the shim channel, to minimise their effect on the magnetic field in the imaging region 10.

FIGS. 16-20 illustrate further embodiments of the present invention, in which shim channel arrangements are provided, not within gradient coil assemblies.

Figure 16:
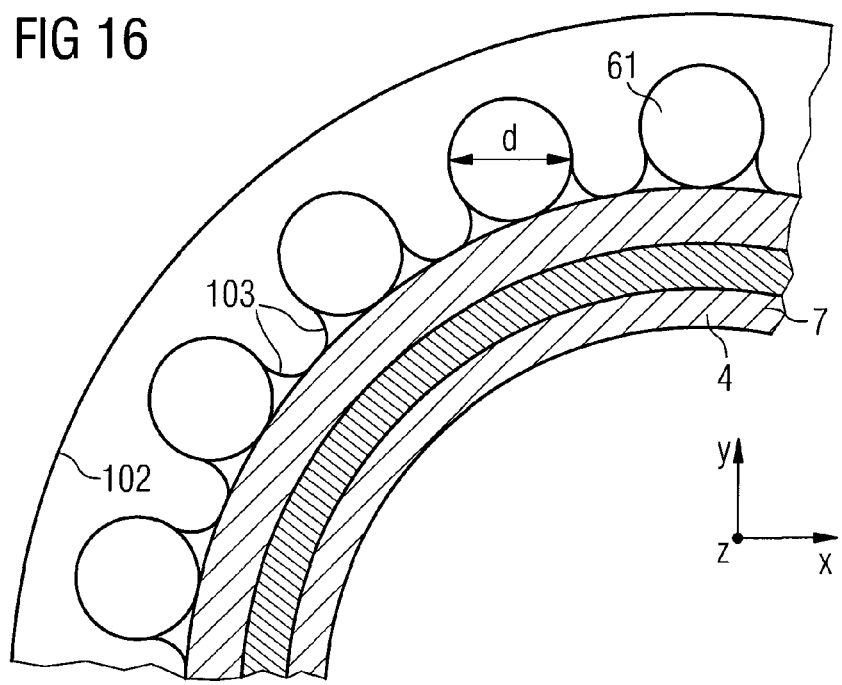
FIG. 16 shows an embodiment of the invention in which shim channels are positioned between the radially outer surface of a gradient coil assembly and the surface of a bore tube.

As shown in FIG. 16, shim channels 61 may be positioned between the radially outer surface of the gradient coil assembly 4 and the bore tube surface 102 of the OVC. In this illustrated embodiment, the gradient coil assembly contains gradient coils 7, but no gradient shield coils. If preferred, gradient shield coils may be included in the gradient coil assembly in this embodiment. The shim channels 61 may be hollow plastic tubes; and may be bonded or otherwise retained, for example by tensile straps, onto the gradient coil assembly. It may be preferred to locate spacers between the shim channels to maintain them in their respective relative positions. Features such as shown at 103 may be moulded onto the radially outer surface of the gradient coil assembly 4 to assist with locating and retaining the shim channels in position. It may be preferred to provide shim channels in such number that they abut against each other around the whole radially outer periphery of the gradient coil assembly, so as to ensure constant spacing between shim channels. Alternatively, the shim channels may be provided as a free-standing frame, comprising axial shim channels themselves, connected by two or more support rings. Such an assembly may be manufactured of moulded plastic or machined composite material such as fibreglass reinforced resin, preferably a material which is electrically non-conducting, non-magnetic, rigid and inexpensive. Such a shim channel assembly could be first mounted into the bore 5 of the outer vacuum chamber (OVC) 1, then the gradient coil assembly 4 may be added later, within the shim channel assembly.

In embodiments in which the shim channels are positioned radially outside the gradient coil assembly 4, it would be advantageous to thermally insulate them from the gradient coil assembly; instead of, or in addition to, forced fluid cooling through the shim channels.

Figure 17:
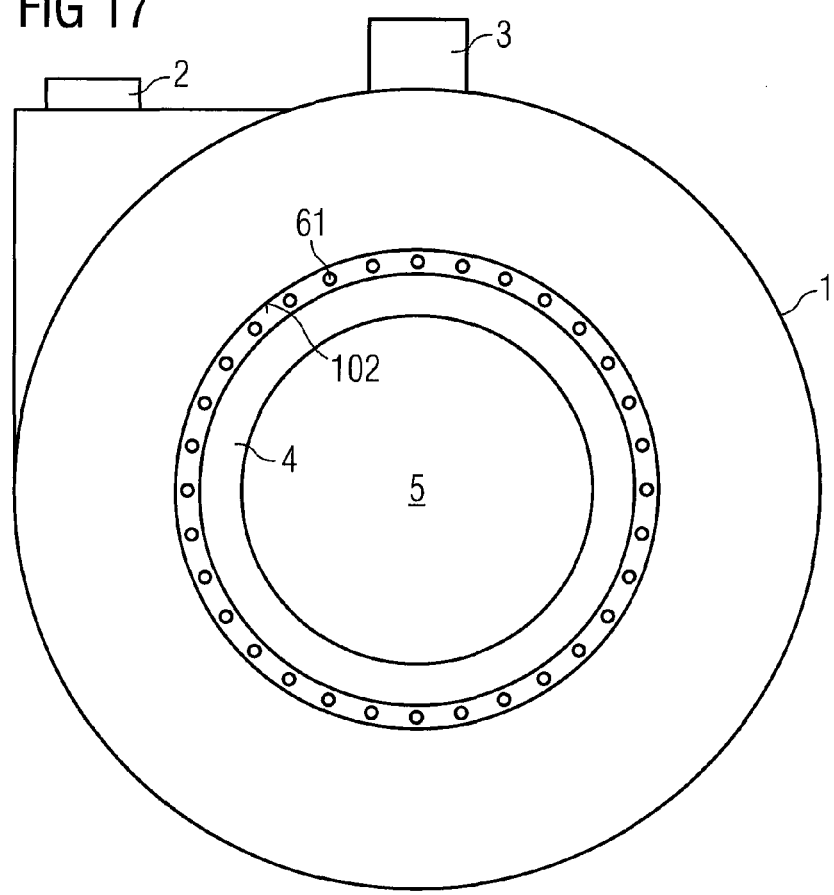
FIG. 17 shows how shim channels of the embodiment of FIG. 16 may be positioned within a hollow cylindrical superconducting magnetic field generator 1.

FIG. 17 shows how shim channels of the embodiment of FIG. 16 may be positioned within a hollow cylindrical superconducting magnetic field generator 1 as described with reference to FIG. 1.

Figure 18:
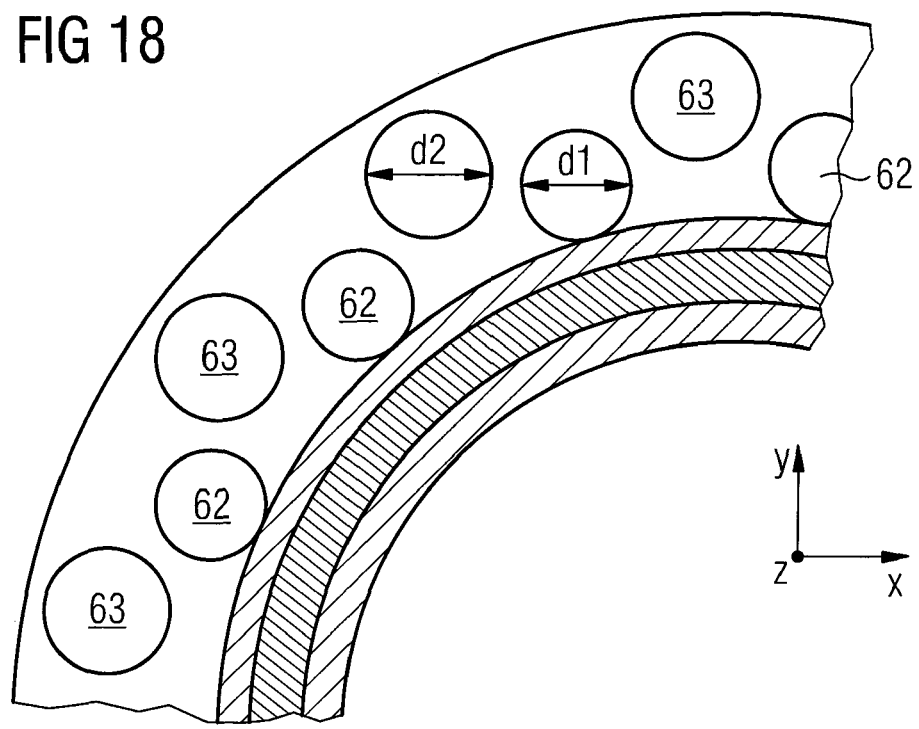
FIG. 18 shows a variant of the embodiment of FIG. 16.

FIG. 18 shows a variant of the embodiment of FIG. 16. As shown in FIG. 18, it is possible to position shim channels 62, 63 at more than one radial distance from the axis of the gradient coil assembly. Each set 62; 63 of shim channels may have a diameter d1; d2 different from the diameter of the other group(s) of shim channels. Mechanical spacers may be provided to retain the shim channels in the required relative positions. In a variant, moulded features may be positioned on the radially outer surface of the gradient coil assembly to help to retain the radially inner 62 set of shim channels in position, with the next set 63 of shim channels being placed intermediately between adjacent shim channels in the first set, and retained in position by tensile traps, for example. Again, the shim channels may be embodied as plastic tubes, bonded or otherwise retained in position. Alternatively, the shim channels and apacers may be a flexible moulding, bent into a cylindrical shape, and retaining itself in position by any appropriate arrangement, or the resilience of the material from which it is moulded.

Figure 19:
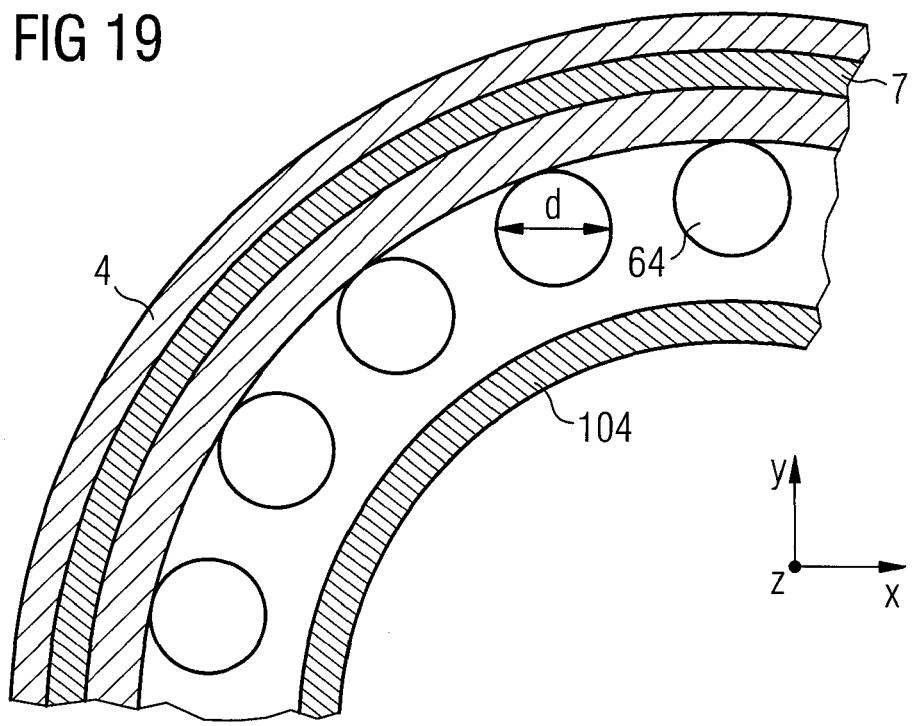
FIG. 19 shows an alternative embodiment of the present invention.

FIG. 19 shows an alternative embodiment of the present invention. As shown in FIG. 19, shim channels 64 may be positioned on the radially inner surface of the gradient coil assembly 4, between the radially inner surface of the gradient coil assembly 4 and homogenous region within the bore 5. Also illustrated in FIG. 19 is a body (RF) coil 104, as used for imaging in MRI systems and positioned within the bore of the gradient coil assembly. The object to be imaged, for example a patient, is positioned within the body (RF) coil. As shown, the shim channels 64 may be positioned between the radially inner surface of the gradient coil assembly 4 and the body (RF) coil 104. In this illustrated embodiment, the gradient coil assembly 4 contains gradient coils 7, but no gradient shield coils. If preferred, gradient shield coils may be included in the gradient coil assembly in this embodiment. The shim channels 6 may be hollow plastic tubes bonded or otherwise retained onto the gradient coil assembly.

In such an arrangement, it may be preferred to locate spacers between the shim channels to maintain them in their respective relative positions. Features may be moulded onto the radially outer surface of the gradient coil assembly to assist with locating and retaining the shim channels in position. It may be preferred to provide shim channels in such number that they abut against each other around the whole radially outer periphery of the gradient coil assembly, so as to ensure constant spacing between shim channels.

In an embodiment, a plastic moulding is provided, comprising tubes forming the shim channels 6, with flexible spacers linking the tubes together. This may be formed as a length of moulding, alternating between tube and spacer. This moulding may then be cut to a length slightly less than the radially inner circumference of the gradient coil assembly, rolled into a cylinder and slid into the gradient coil assembly. The resilience of the moulding material itself may be sufficient to retain the shim channels in position; alternatively, rings of a solid, non-magnetic and non-conductive material, such as glass fibre, may be introduced to press the shim channels into position, in contact with the inner surface of the gradient coil assembly 4. In some arrangements, the body (RF) coil 104 may serve to retain the shim channels in position. Shim elements positioned between the gradient coil assembly 4 and the body (RF) coil 104 may interfere with RF return flux, which may be cured by retuning the body (RF) coil.

Figure 20:
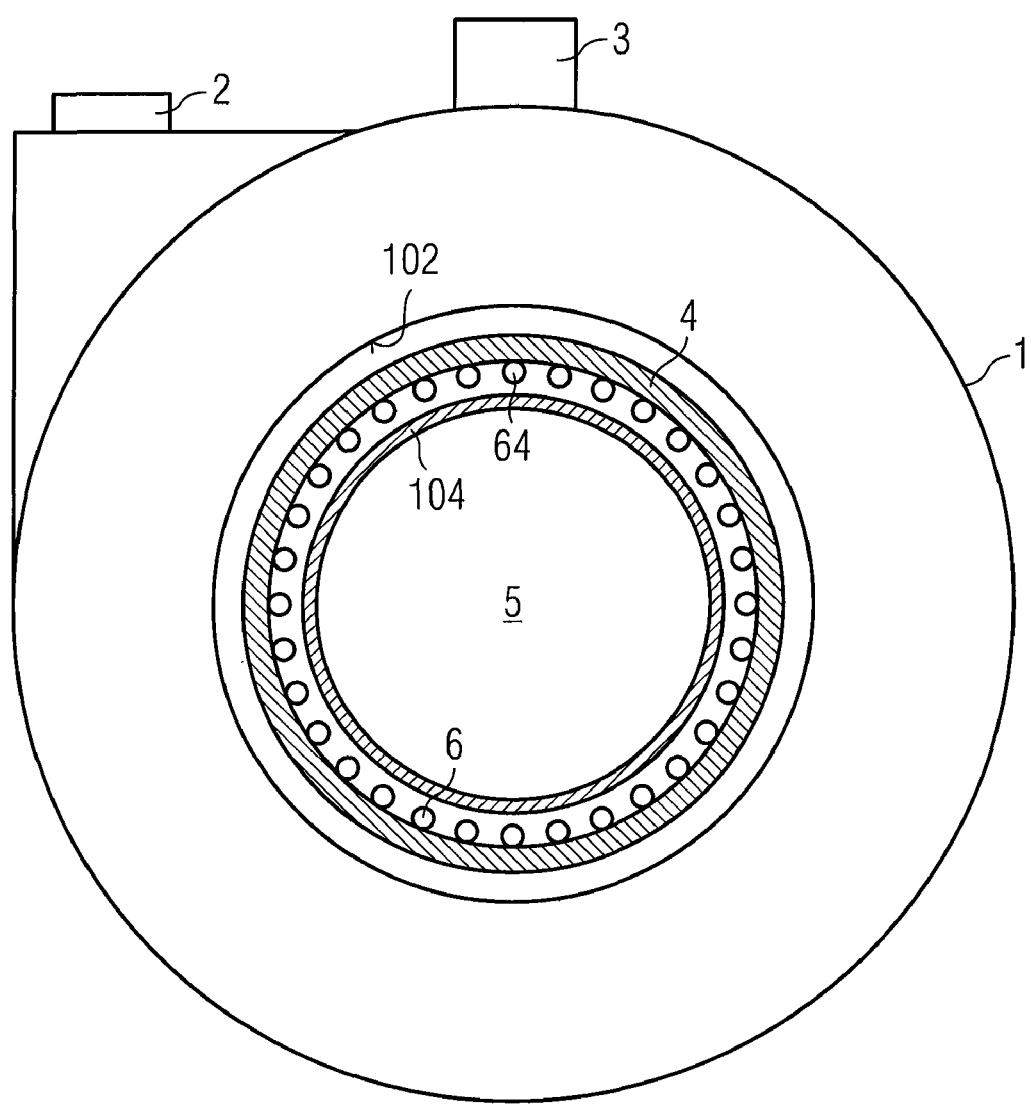
FIG. 20 shows how shim channels 64 of the embodiment of FIG. 19 may be positioned within a hollow cylindrical superconducting magnetic field generator 1.

FIG. 20 shows how shim channels 64 of the embodiment of FIG. 19 may be positioned within a hollow cylindrical superconducting magnetic field generator 1 as described with reference to FIG. 1.

While the present invention has been described in its general form, various possible embodiments of the shim pieces themselves will now be described, along with their attendant benefits.

Figure 6:
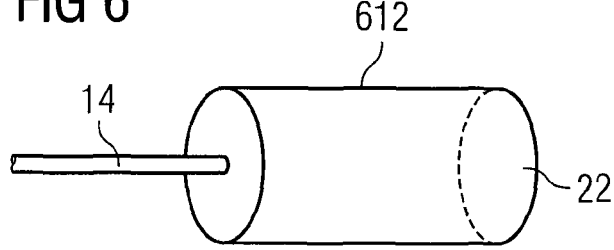
FIGS. 6-10 schematically illustrate shim pieces useful in embodiments of the present invention.

FIG. 6 shows an example of a simple shim piece 612 as may be employed in the present invention. The shim piece is composed of a cylinder 22 of magnetic material, such as iron or steel, attached to a suitable rod 14. The radial cross-sectional diameter of the cylinder enables the shim piece 612 to fit snugly within the shim channel, but yet sufficiently loosely that it can be moved axially within the shim channel with little applied force. As illustrated in FIG. 3, each shim channel 6 may house two of these shim pieces, each introduced from a respective end of the shim channel. By providing rods 14 which are longer than the half-length of the shim channel, two shim pieces may be located in the same axial half of a shim channel, providing increased range of shimming, if required.

Further refinements are possible if it is found that additional degrees of freedom are needed to find shimming solutions which provide an acceptable magnetic field homogeneity in the imaging region 10.

Figure 7:
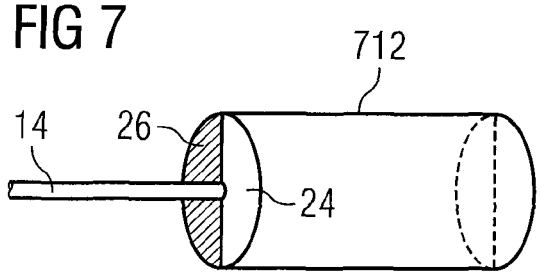

FIG. 7 shows an example of a shim piece 712 having eccentrically placed shim material. The cylindrical shape of the shim piece is similar to that of the shim piece 612 of FIG. 6. However, the cylinder is divided axially into two halves. One half 24 of the cylinder is composed of a magnetic material, while the other half 26 is composed of a non-magnetic material. The rod 14 is joined at the centre of the radial cross-section of the cylinder. The shimming effect of such a shim piece is equivalent to a half-cylinder of magnetic material, and the non-magnetic half-cylinder is provided only to ensure that the magnetic half-cylinder remains in position within the shim channel. By rotating the rod 14, the radial position of the centroid of the magnetic material 26 can be adjusted by a few millimetres. In a similar embodiment a flat is put on one side of an otherwise cylindrical shim piece, effectively resulting in an off-centre magnetic effect. The effect of shim pieces on the shimmed magnetic field in the homogenous region is very sensitive to the radial position of each shim piece, so this feature of shim pieces whose effect is off-centre within the radial cross-section of the shim channels can be used to fine-tune the shimming. A particular advantage of this arrangement as compared to moving the axial location of the shim material is that the harmonic corrections contributed by a shim piece will vary in strength as it is rotated, but will remain in the same relative proportions.

In another optional feature, the volume of the shim piece(s) in adjacent shim channels could be varied, for example by varying the radial cross-section or axial length of the shim pieces. One particularly advantageous arrangement provides consecutive shim channels with shim pieces in a repeating pattern of shim effect, for example (1, 3, 5, 3, 1)(3, 1, 5, 1, 3)(5, 3, 1, 3, 5) . . . that is, the volume of the shims may vary in the indicated proportion and/or differing materials may be used to obtain the indicated ratio of shim effects. Placing small shim pieces near to large shim pieces, in terms of their angular position around the bore 5 of the magnet, gives additional freedom to the optimization algorithm. For example, if the optimization algorithm needs to concentrate a large quantity of shim material in one spot to compensate a local region of inhomogeneity in the magnetic field, then all the shim pieces in a (1,3,5,3,1) group can be moved axially into positions corresponding to the local inhomogeneity, giving a total of 2×1+2×3+5=13 units. If only a small quantity of iron is needed, then only a single 1 unit shim piece would be used. Other combinations of elements from the local group can be used to achieve a quasi-continuous variation between these two extremes, covering all steps in the range 1 to 13 units. For example: 4=3+1 or 9=5+3+1. Furthermore the shim algorithm can choose either one of the shim elements of a certain value from a given group, as best suited to suppressing the local inhomogeneity. Even more freedom is provided by alternating between (1,3,5,3,1) and (3,1,5,1,3) and (5,3,1,3,5) groups. It is desirable to use a repeating pattern, not random, for simplicity of the shim algorithm. This technique allows a discrete array of shim pieces to provide a quasi-continuous variation.

Figure 8A:
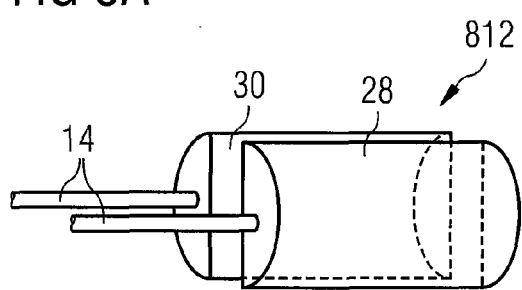
Figure 8B:
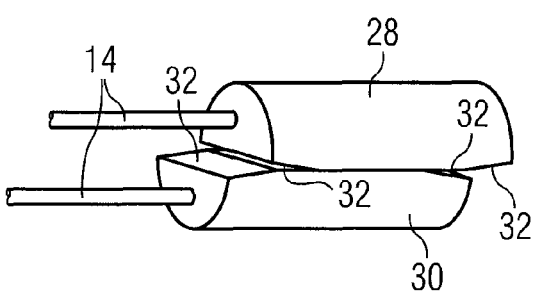
Figure 9:
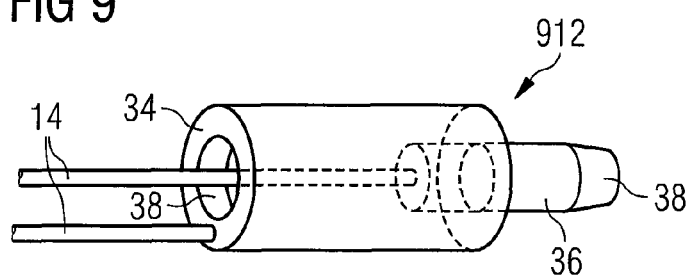

As illustrated in FIGS. 8A-9, more than one shim element can be placed in each axial half of a shim channel. In the arrangement illustrated in FIG. 8A, the shim-piece of FIG. 6 has been divided diametrically in half. Each half 28, 30 is attached to its own respective rod 14. The two shim pieces 28, may be placed together at a same axial position, giving a shim effect similar to the effect obtained from a shim piece as shown in FIG. 6. Alternatively, the two shim-pieces 28, 30 may be positioned at different axial positions, being slid apart within the shim channel. As best seen in FIG. 8B, edges 32 of the shim pieces 28, 30 may be chamfered to assist the shim pieces moving past one another. If desired, the two parts 28, 30, may be made of unequal size, allowing further refinement of the shimming ability of the shim channel. FIG. 9 illustrates a different arrangement with a similar effect. In FIG. 9, shim piece 912 has a radial cross section divided into two concentric parts: an outer, hollow cylinder 34 and an inner cylinder 36, each having its own rod 14. The two parts 34, 36 may be of equal volumes, so having substantially equal shimming effects, or may be of differing volumes, allowing further refinement of the shimming ability of the shim channel. One or both of the parts 34, 36 may have chamfered edges 38 to assist the shim pieces to move past one another.

Figure 10:
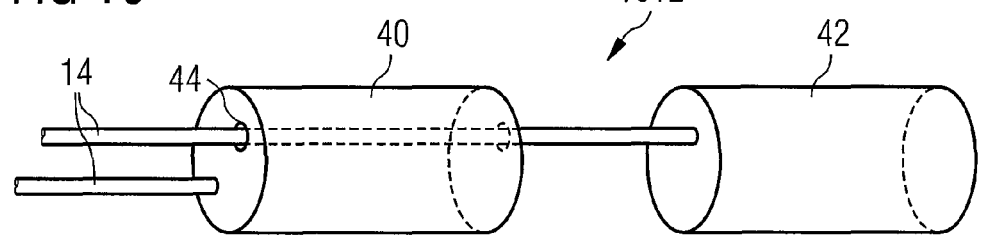

FIG. 10 shows an alternative arrangement which allows two shim pieces to be positioned independently within a single shim channel. Two cylindrical shim pieces 40, 42 are provided, each with its own rod 14. The shim pieces are inserted into a shim channel 6 so that shim piece 42 is axially nearer the centre of the shim channel 6 than shim piece 40 is. Shim piece 40 has a through-hole 44, through which the rod 14 of shim piece 42 may pass, enabling separate control of the position of shim piece 42. Shim piece 42 may be provided with a similar though-hole to equalise the shim effect of the two pieces, or to simplify manufacture.

While the various optional features of the shim pieces described with reference to FIGS. 6-10 have been described with particular reference to cylindrical shim pieces, the shim pieces may alternatively be shaped as a disc, plate, ball, cuboid and so on.

FIGS. 11A-11B and 12A-12B illustrate alternative embodiments in which an alternative to the rods 14 is provided for moving the shim pieces within the shim channel. Rather than having a rod 14 rigidly attached to the shim pieces, the shim pieces of FIGS. 11 and 12 have a threaded rod 46 passing axially through the respective shim piece 1112, 1212. The shim piece 1112, 1212 has a co-operating threaded through-hole through which the threaded rod passes. Rather than moving the shim piece within a shim channel by pushing or pulling on a fixed rod, the shim pieces of FIGS. 11A, 12A are moved by rotating the threaded rod 46. The shim-pieces are unable to rotate within the shim channels, and are driven axially along the shim channel by operation of the co-operating threads on the threaded rod 46 and the threaded through-hole. A threaded rod of length equal to half the axial length of the shim channel may be introduced from each end of the shim channel, along with a shim piece 1112, 1212. The threaded rod need not protrude from the end of the shim channel, but must be provided with a means for causing it to rotate, for example, a handle or wheel. An electric motor, for example a stepper motor, may be provided to rotate the threaded rod 46, adding a degree of automation to the process of shimming. In these embodiments, it is important to ensure that the shim piece 1112, 1212 itself cannot rotate within the shim channel. This may be simply achieved by using shim pieces and shim channels which do not have a circular radial cross-section. In the embodiment of FIGS. 11A-11B, the shim piece 1112 and the shim channel both have a square radial cross-section. In the embodiment of FIGS. 12A-12B, the shim piece and the shim channel have radial cross-sections provided with keys 48 which allow the shim piece to move axially within the shim channel, but prevent it from rotating. In embodiments employing a threaded rod 46, it may be found unnecessary to provide separate retaining means. Interaction between each threaded rod and the threaded through-hole within the respective shim piece may be found sufficient to retain the shim piece in position. The threaded rod will need to be axially retained in position within the shim channel, for example by a suitable mounting at the opening of the shim channel.

FIG. 13 shows an example of a shim piece 1312 having through-holes 50, permitting a flow of air or other fluid through shim pieces, allowing their temperature to be controlled. The magnetic properties of materials vary with their temperature, and the gradient coils heat due to ohmic dissipation during operation, so it may become important to stabilise the magnetic effect of the shim pieces by stabilising their temperature.

Although the present invention has been described with reference to the movement and retention in position of the shim pieces, either by simple rods 14 and clamps 16, or threaded rods 46 and threaded shim pieces 1112, 1212, any suitable arrangement may be provided for moving each shim piece axially within its shim channel, and retaining it in position.

As discussed above, the shim pieces may be of differing radial cross-sectional sizes, and the shim channels may be of correspondingly different radial cross-sectional areas.

In a certain embodiment, 128 shim channels may be provided, each of diameter 11 mm, at a constant radial position from the axis. Compared to a conventional arrangement, in which 16 shim slots are provided, each of rectangular cross-section 85×20 mm, the present invention requires the removal of only 45% the volume of material removed in the conventional arrangement. The stiffness of the remaining gradient coil assembly may be greater than in the conventional arrangement, reducing vibration when pulsing the gradient coils in an imaging sequence of an MRI imaging system. The shim assembly may occupy only 11 mm radial dimension of the gradient coil assembly, rather than over 20 mm typically occupied by conventional shim slots, allowing about 9 mm reduction in the radial dimension of the gradient coil assembly. This may be translated into a correspondingly greater internal bore diameter, increasing the volume available to accommodate a patient, or a reduction in the diameter of the magnetic field generator, for example containing superconducting magnet coils, leading to reduced costs. Alternatively, or in addition, the gradient coil assembly can be redesigned to be more efficient in terms of current required to generate a given gradient field strength, as more freedom is allowed in the design of the coils. The resonance modes of the gradient coil assembly will change, and are expected to change to higher frequencies, which are less likely to be excited into resonance in use.

The shim channels 6 themselves have been described, with reference to FIGS. 2A and 2B, as being positioned in the radial interval of the gradient coil assembly between the gradient coils 7 and the gradient shield coils 7A. However, the shim arrangement of the present invention may be positioned radially within the gradient coil assembly, inside the gradient coils between the gradient coils 7 and the bore of the gradient coil assembly or they may be placed within the gradient coil assembly, between the gradient shield coils 7A and the bore surface of the outer vacuum chamber. In other embodiments, the shim arrangement of the present invention may be positioned not within the gradient coil assembly, for example radially inside the gradient coil assembly, or they may be placed radially outside the gradient coil assembly, between the gradient coil assembly 4 and the bore surface of the outer vacuum chamber (OVC). This latter position may be found to provide better stability because the material of the shim pieces is not directly heated by the gradient coil, and can be more easily cooled. A greater mass of shim material would be needed for the same shimming effect at such an increased radial separation from the imaging region 10.

The present invention is also compatible with so-called "active" shimming: the technique of adjusting currents in additional coils suitably located within the system, either resistive or superconducting, to improve the homogeneity, as will be known to those familiar with the art. Indeed, it is envisaged that the present invention will be used in conjunction with conventional first order active shimming, for example by reserving a fraction of the available gradient coil current for shimming purposes rather than imaging use, and applying a DC offset to reduce first order errors. The shim algorithm can calculate the gradient coil currents required to provide the optimum shim distribution solution.

The present invention accordingly provides a shim arrangement, and a corresponding shimming method, in which shim pieces are present within shim channels, and shimming progresses by relocating shim pieces within the shim channels. No shim pieces are added or removed during the shimming process, which preferably progresses with the magnet at field. Where a shim piece is not required for shimming, the shim piece is simply moved to its furthest extent away from the imaging region 10, so as to minimise its effect on the magnetic field within the imaging region. According to the present invention, a quantity of shim material is placed within the shim channels before the magnet is ramped up, and shimming progresses by rearranging that shim material. No shim material is added or removed during shimming, and the magnet is at field throughout the shimming process. This saves much time and money, by avoiding the need to ramp the magnet down and back up again between shimming iterations.

While the present invention has been particularly described with reference to the shimming of magnetic fields within an imaging region of a magnet used for MRI imaging, it may be applied to the improvement of the homogeneity of a magnetic field within any homogeneous field region, regardless of the purpose to which the resultant homogeneous field is put.

While the present invention has been particularly described with regards to shimming methods which are carries out with the magnet at field, the shimming arrangement of the present invention may also be used in methods which involve ramping the magnet down between shimming iterations.

It is a known problem that the homogeneity of passively shimmed magnets is subject to temperature instability caused by heating, or heat-induced motion, of the shim pieces after initial shimming has been carried out as described above. In further embodiments of the present invention, the shim arrangement is arranged to correct for variations in the homogeneity of the field in the imaging region after initial shimming is complete. More particularly, automated drift compensation may be provided to periodically measure the homogeneity of the magnetic field in the homogeneous field region, typically using MRI methods, to calculate a movement of shim pieces which would compensate for any degradation in the measured homogeneity and to move shim pieces in accordance with the calculated movement.

The following documents have been found to offer rather different solutions to similar problems: U.S. Pat. No. 6,313,634 U.S. Pat. No. 6,617,853 U.S. Pat. No. 7,224,167 and US20070216413A1.

To correct for degradation in homogeneity of the magnetic field in the homogenous field region due to temperature-induced change in magnetization or position of the passive shim pieces, additional features may be provided, according to certain embodiments of the present invention, to actively move the shim elements axially by small amounts as part of a feedback loop.

A sensor may be provided to detect and measure change in the magnetic field homogeneity. The sensor may be an MRI phantom of conventional structure in the patient table, or any other conventional alternative. A calculation device is also required, to calculate movements of shim pieces which would correct the detected inhomogeneities. Such calculation devices are known and available to those skilled in the art. An actuator is also required, to move shim elements by the calculated movements. Such actuators may be pneumatic, electrical, or indeed any suitable devices. Ideally, the actuators would be remote from the homogeneous field region, to avoid interference with the field in that region. Conveniently, rods 14 or threaded rods 46 as described above may be used, in conjunction with appropriate shim devices, and electric motors, such as stepper motors, may be arranged to drive the rods 14 or threaded rods 46 as appropriate to cause the required movement of shim pieces.

One significant shortcoming of conventional passive shimming arrangements is that the shims are difficult to access, and the shims may only be altered by ramping down the magnet, modifying the distribution of shim material and ramping the magnet up again. This is such an onerous task that passive shimming is rarely adjusted to correct for changes in the homogeneous field regions after initial shimming, caused for example by changes in the quality or position of iron in the magnet's environment, for example, the re-positioning of iron girders during building work.

According to the present invention, each shim channel contains few shim elements which can easily be accessed from the ends of the shim channel. The positions of the shims may be adjusted with the magnet at field, and the measurement of field homogeneity, calculation of corrective movements of the shim pieces, and corresponding movement of the shim pieces may be carried out automatically according to certain embodiments of the present invention.

The present invention opens the attractive possibility of actively controlling the positions of the shim pieces during imaging to compensate for temperature drift. Ideally this would be done with cable drives attached to flexible rods 14. The associated motors could be mounted on the OVC 1, magnetically shielded from the homogeneous field region. Alternatively pneumatic or hydraulic positioning and movement may be used.

When applied to an MRI or NMR imaging system, an active feedback loop can be envisaged in which an image signal from one or more samples in the imaging region (conveniently located in a patient table for example) is monitored, harmonics calculated and shim position corrections determined and applied to compensate drift in real time. It would not be necessary to adjust the positions of all of the shim pieces to control many harmonics. It is believed that movement of as few as 8 or 16 shim pieces would provide substantial drift compensation.

These embodiments of the invention accordingly provide a method and apparatus for adjusting the shimming of a magnet at field using an array of shim pieces attached to moveable rods in an array of shim channels, which may be located within a gradient coil assembly, for example between gradient coils and gradient shield coils. The axial positions of some or all shim elements can be controlled by actuators in a feedback loop to maintain homogeneity of the magnetic field in the homogeneous field region. This may usefully compensate for changes due to temperature, for example caused by heating of the gradient coil assembly in use, or any other source of change in homogeneity of the magnetic field in the imaging region.

Figure 14:
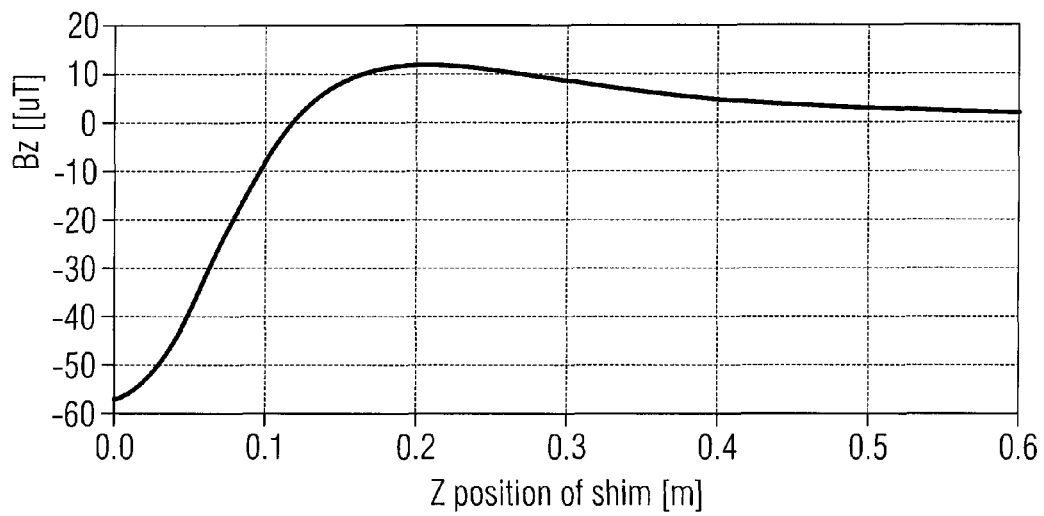
FIG. 14 shows an axial component of flux density as a function of the position of a shim plate.

As an aid to understanding the interaction of the magnetic field with shim pieces, FIG. 14 shows the axial component of flux density (in micro Tesla) as a function of the z position of a saturated cuboid shim plate made of silicon steel with dimensions 65×80×0.28 mm, the shim being displaced 0.16 m from the measurement point in the radial direction.

Figure 15:
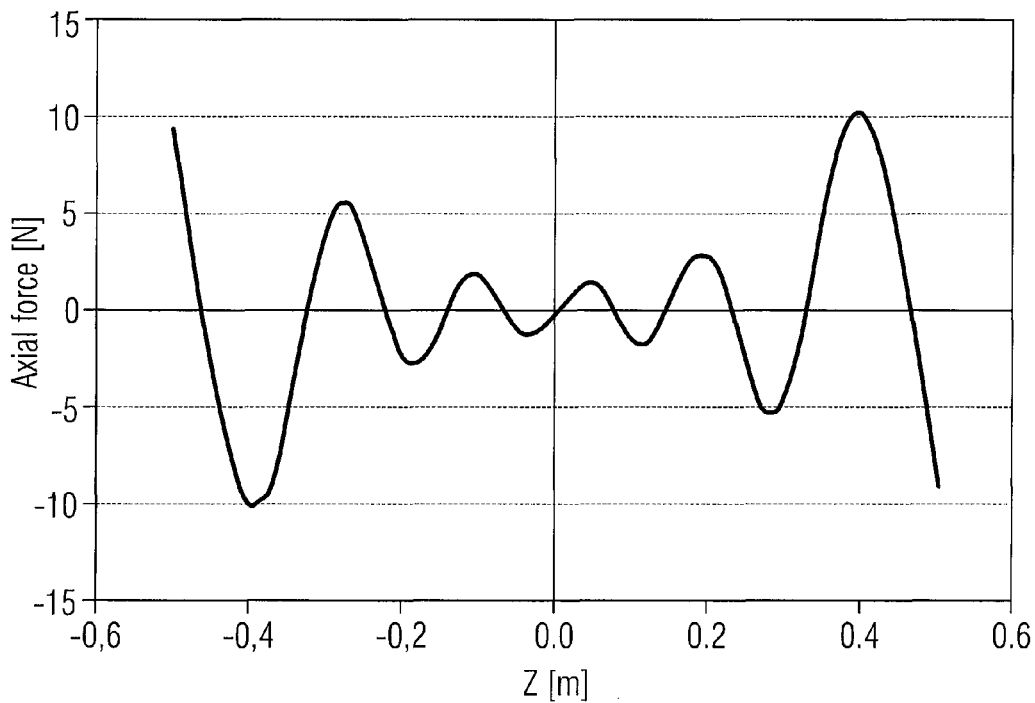
FIG. 15 shows the force on a shim piece at various axial positions.

FIG. 15 shows the force on a shim piece at various axial positions, and indicates that the force acting on the shim piece is tolerably low until an attempt is made to remove the shim piece from the magnet. The force acting on a shim piece is given by:

$$F := M \cdot V \cdot \left(\frac{d}{dz}B\right)$$

where M is the magnetization, V is the volume and dB/dz is the flux density gradient. In particular, FIG. 15 shows the how the force on a cylindrical shim of volume 1.4 cm$^3$ varies along the length of a shim slot at radius 0.4 m in a typical 1.5 T solenoid superconducting magnet.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A cylindrical superconducting magnet arrangement comprising:
a hollow cylindrical superconducting magnetic field generator having a bore;
further comprising
a shim arrangement for modifying the homogeneity of a magnetic field within a homogeneous field region,
the shim arrangement itself comprising:
shim channels extending axially within the bore, in a volume between the magnetic field generator and the homogeneous field region,
at least one shim piece comprising magnetic material located within each shim channel;
retaining means for retaining each shim piece in an axial position;
an arrangement for moving each shim piece axially within the corresponding shim channel while the magnetic field generator is generating a magnetic field, thereby to relocate the shim pieces within the corresponding shim channels, whereby to modify the homogeneity of the magnetic field over the homogeneous field region;
wherein the retaining means serve to retain each shim piece in its adjusted axial position, and wherein the arrangement for moving each shim piece axially within the corresponding shim channel is operable to adjust the axial position of each shim piece within the corresponding shim channel without adding or removing any shim pieces to or from the shim channels,
further comprising a hollow cylindrical gradient coil assembly located within the bore and comprising coils for generating magnetic field gradients in a homogeneous field region located within the bore, wherein the shim channels are formed within the gradient coil assembly and extend axially therethrough,
wherein the gradient coil assembly comprises gradient coils and gradient shield coils, positioned radially outside the gradient coils; the gradient coils and gradient shield coils are embedded within a potting material and the shim channels are formed within the potting material, radially between the gradient coils and the gradient shield coils.

2. A cylindrical superconducting magnet arrangement according to claim 1, further comprising an arrangement for directing a flow of fluid at a controlled temperature through at least one of the shim channels.

3. A cylindrical superconducting magnet arrangement according to claim 2, wherein one or more of the shim pieces is provided with through-holes allowing the fluid to pass through the shim piece.

4. A cylindrical superconducting magnet arrangement according to claim 1, wherein the volume and/or type of magnetic material in consecutive shim channels varies, such that the relative shim effect is provided substantially in the ratio 1, 3, 5, 3, 1, 3, 1, 5, 1, 3, 5, 3, 1, 3, 5 . . . and so on.

5. A cylindrical superconducting magnet arrangement according to claim 1, wherein the magnetic field generator generates a magnetic field within the homogeneous field region with a magnetic flux density of 0.1 T or more.

6. A cylindrical superconducting magnet arrangement according to claim 1, further comprising an arrangement for correcting degradation in homogeneity of the magnetic field in the homogenous field region, comprising:
one or more sensors arranged to detect and measure change in the magnetic field homogeneity;
a calculation device arranged to calculate desired movements of certain shim pieces suitable to correct the detected change in the magnetic field homogeneity; and
an actuator arranged to move the certain shim elements by the calculated desired movements.

7. An MRI system comprising a cylindrical superconducting magnet arrangement according to claim 1.

8. A cylindrical superconducting magnet arrangement comprising:
a hollow cylindrical superconducting magnetic field generator having a bore;
further comprising
a shim arrangement for modifying the homogeneity of a magnetic field within a homogeneous field region,
the shim arrangement itself comprising:
shim channels extending axially within the bore, in a volume between the magnetic field generator and the homogeneous field region,
at least one shim piece comprising magnetic material located within each shim channel;
retaining means for retaining each shim piece in an axial position;
an arrangement for moving each shim piece axially within the corresponding shim channel while the magnetic field generator is generating a magnetic field,
thereby to relocate the shim pieces within the corresponding shim channels, whereby to modify the homogeneity of the magnetic field over the homogeneous field region;
wherein the retaining means serve to retain each shim piece in its adjusted axial position, and wherein the arrangement for moving each shim piece axially within the corresponding shim channel is operable to adjust the axial position of each shim piece within the corresponding shim channel without adding or removing any shim pieces to or from the shim channels,
further comprising a hollow cylindrical gradient coil assembly located within the bore and comprising coils for generating magnetic field gradients in a homogeneous field region located within the bore, wherein the shim channels are formed within the gradient coil assembly and extend axially therethrough,
wherein the gradient coil assembly comprises gradient coils and gradient shield coils, positioned radially outside the gradient coils; the gradient coils and gradient shield coils are embedded within a potting material and the shim channels are formed within the potting material, radially outside the gradient coils and the gradient shield coils.

9. A cylindrical superconducting magnet arrangement according to claim 8, further comprising an arrangement for directing a flow of fluid at a controlled temperature through at least one of the shim channels.

10. A cylindrical superconducting magnet arrangement according to claim 9, wherein one or more of the shim pieces is provided with through-holes allowing the fluid to pass through the shim piece.

11. A cylindrical superconducting magnet arrangement according to claim 8, wherein the volume and/or type of magnetic material in consecutive shim channels varies, such that the relative shim effect is provided substantially in the ratio 1, 3, 5, 3, 1, 3, 1, 5, 1, 3, 5, 3, 1, 3, 5 . . . and so on.

12. A cylindrical superconducting magnet arrangement comprising:
  a hollow cylindrical superconducting magnetic field generator having a bore;
  further comprising
  a shim arrangement for modifying the homogeneity of a magnetic field within a homogeneous field region,
  the shim arrangement itself comprising:
  shim channels extending axially within the bore, in a volume between the magnetic field generator and the homogeneous field region,
  at least one shim piece comprising magnetic material located within each shim channel;
  retaining means for retaining each shim piece in an axial position;
  an arrangement for moving each shim piece axially within the corresponding shim channel while the magnetic field generator is generating a magnetic field, thereby to relocate the shim pieces within the corresponding shim channels, whereby to modify the homogeneity of the magnetic field over the homogeneous field region;
  wherein the retaining means serve to retain each shim piece in its adjusted axial position, and wherein the arrangement for moving each shim piece axially within the corresponding shim channel is operable to adjust the axial position of each shim piece within the corresponding shim channel without adding or removing any shim pieces to or from the shim channels,
  further comprising a hollow cylindrical gradient coil assembly located within the bore and comprising coils for generating magnetic field gradients in a homogeneous field region located within the bore, wherein the shim channels are formed within the gradient coil assembly and extend axially therethrough,
  wherein the gradient coil assembly comprises gradient coils and gradient shield coils, positioned radially outside the gradient coils, the gradient coils and gradient shield coils are embedded within a potting material and the shim channels are formed within the potting material, radially within the gradient coils and the gradient shield coils.

13. A cylindrical superconducting magnet arrangement according to claim 12, further comprising an arrangement for directing a flow of fluid at a controlled temperature through at least one of the shim channels.

14. A cylindrical superconducting magnet arrangement according to claim 13, wherein one or more of the shim pieces is provided with through-holes allowing the fluid to pass through the shim piece.

15. A cylindrical superconducting magnet arrangement according to claim 12, wherein the volume and/or type of magnetic material in consecutive shim channels varies, such that the relative shim effect is provided substantially in the ratio 1, 3, 5, 3, 1, 3, 1, 5, 1, 3, 5, 3, 1, 3, 5 . . . and so on.

16. A cylindrical superconducting magnet arrangement comprising:
  a hollow cylindrical superconducting magnetic field generator having a bore;
  further comprising
  a shim arrangement for modifying the homogeneity of a magnetic field within a homogeneous field region,
  the shim arrangement itself comprising:
  shim channels extending axially within the bore, in a volume between the magnetic field generator and the homogeneous field region,
  at least one shim piece comprising magnetic material located within each shim channel;
  retaining means for retaining each shim piece in an axial position;
  an arrangement for moving each shim piece axially within the corresponding shim channel while the magnetic field generator is generating a magnetic field, thereby to relocate the shim pieces within the corresponding shim channels, whereby to modify the homogeneity of the magnetic field over the homogeneous field region;
  wherein the retaining means serve to retain each shim piece in its adjusted axial position, and wherein the arrangement for moving each shim piece axially within the corresponding shim channel is operable to adjust the axial position of each shim piece within the corresponding shim channel without adding or removing any shim pieces to or from the shim channels,
  wherein the arrangement for moving each shim piece along the corresponding shim channel comprises a number of rods attached to respective shim pieces such that the position of a shim piece within the shim channel may be adjusted by driving a corresponding rod in to or out of the shim channel.

17. A cylindrical superconducting magnet arrangement according to claim 16 wherein the retaining means for retaining each shim piece in position comprises a clamp arrangement acting to hold each rod near an end of the shim channel.

18. A cylindrical superconducting magnet arrangement according to claim 16, further comprising an arrangement for directing a flow of fluid at a controlled temperature through at least one of the shim channels.

19. A cylindrical superconducting magnet arrangement according to claim 18, wherein one or more of the shim pieces is provided with through-holes allowing the fluid to pass through the shim piece.

20. A cylindrical superconducting magnet arrangement according to claim 16, wherein the volume and/or type of magnetic material in consecutive shim channels varies, such that the relative shim effect is provided substantially in the ratio 1, 3, 5, 3, 1, 3, 1, 5, 1, 3, 5, 3, 1, 3, 5 . . . and so on.

21. A cylindrical superconducting magnet arrangement comprising:
  a hollow cylindrical superconducting magnetic field generator having a bore;
  further comprising
  a shim arrangement for modifying the homogeneity of a magnetic field within a homogeneous field region,
  the shim arrangement itself comprising:
  shim channels extending axially within the bore, in a volume between the magnetic field generator and the homogeneous field region,
  at least one shim piece comprising magnetic material located within each shim channel;
  retaining means for retaining each shim piece in an axial position;
  an arrangement for moving each shim piece axially within the corresponding shim channel while the magnetic field generator is generating a magnetic field, thereby to relocate the shim pieces within the corresponding shim channels, whereby to modify the homogeneity of the magnetic field over the homogeneous field region;
  wherein the retaining means serve to retain each shim piece in its adjusted axial position, and wherein the arrangement for moving each shim piece axially within the corresponding shim channel is operable to adjust the axial position of each shim piece within the corresponding shim channel without adding or removing any shim pieces to or from the shim channels, wherein the arrangement for moving each shim piece along the corresponding shim channel comprises a number of threaded rods, each co-operating with a threaded through-hole within a respective shim piece, such that the position of a shim piece within the shim channel may be adjusted by rotating the threaded rod with respect to the respective shim piece.

22. A cylindrical superconducting magnet arrangement according to claim 21, wherein the retaining means for retaining each shim piece in position comprises an interaction between each threaded rod and the threaded through-hole within the respective shim piece.

23. A cylindrical superconducting magnet arrangement according to claim 21, wherein the shim pieces and the shim channels have corresponding non-circular radial cross-sections.

24. A cylindrical superconducting magnet arrangement comprising:
   a hollow cylindrical superconducting magnetic field generator having a bore;
   further comprising
   a shim arrangement for modifying the homogeneity of a magnetic field within a homogeneous field region,
   the shim arrangement itself comprising:
   shim channels extending axially within the bore, in a volume between the magnetic field generator and the homogeneous field region,
   at least one shim piece comprising magnetic material located within each shim channel;
   retaining means for retaining each shim piece in an axial position;
   an arrangement for moving each shim piece axially within the corresponding shim channel while the magnetic field generator is generating a magnetic field, thereby to relocate the shim pieces within the corresponding shim channels, whereby to modify the homogeneity of the magnetic field over the homogeneous field region;
   wherein the retaining means serve to retain each shim piece in its adjusted axial position, and wherein the arrangement for moving each shim piece axially within the corresponding shim channel is operable to adjust the axial position of each shim piece within the corresponding shim channel without adding or removing any shim pieces to or from the shim channels,
   wherein at least one of the shim channels contains a plurality of shim pieces, each of said shim pieces being provided with a respective arrangement for moving the shim piece and retaining means for retaining the shim piece in position, said shim pieces having complementary radial cross-sectional areas, such that the plurality of shim pieces may overlap within the shim channel.

25. A cylindrical superconducting magnet arrangement according to claim 24, wherein the plurality of shim pieces, taken together when overlapping, have a combined radial cross-section substantially the same as the radial cross-section of the shim channel.

26. A cylindrical superconducting magnet arrangement according to claim 24, wherein said plurality of shim pieces have radial cross-sectional areas corresponding to sectors of the radial cross-sectional area of the shim channel.

27. A cylindrical superconducting magnet arrangement according to claim 24, wherein said plurality of shim pieces include first shim piece having an axial through-hole, and a complementary second shim piece radially dimensioned to pass through the through-hole in the first shim piece.

28. A cylindrical superconducting magnet arrangement comprising:
   a hollow cylindrical superconducting magnetic field generator having a bore;
   further comprising
   a shim arrangement for modifying the homogeneity of a magnetic field within a homogeneous field region,
   the shim arrangement itself comprising:
   shim channels extending axially within the bore, in a volume between the magnetic field generator and the homogeneous field region,
   at least one shim piece comprising magnetic material located within each shim channel;
   retaining means for retaining each shim piece in an axial position;
   an arrangement for moving each shim piece axially within the corresponding shim channel while the magnetic field generator is generating a magnetic field, thereby to relocate the shim pieces within the corresponding shim channels, whereby to modify the homogeneity of the magnetic field over the homogeneous field region;
   wherein the retaining means serve to retain each shim piece in its adjusted axial position, and wherein the arrangement for moving each shim piece axially within the corresponding shim channel is operable to adjust the axial position of each shim piece within the corresponding shim channel without adding or removing any shim pieces to or from the shim channels,
   wherein at least one of the shim channels contains a plurality of shim pieces, each of said shim pieces being provided with a respective arrangement for moving the shim piece and retaining means for retaining the shim piece in position, said shim pieces being arranged at different positions within the shim channel, one or more through holes being provided to allow an arrangement for moving one shim piece to pass through another shim piece.

* * * * *